(12) United States Patent
Chen et al.

(10) Patent No.: US 11,187,964 B2
(45) Date of Patent: Nov. 30, 2021

(54) INFRARED NON-LINEAR OPTICAL CRYSTAL, PREPARATION PROCESS AND APPLICATION THEREOF

(71) Applicant: FUJIAN INSTITUTE OF RESEARCH ON THE STRUCTURE OF MATTER, CHINESE ACADEMY OF SCIENCES, Fujian (CN)

(72) Inventors: Ling Chen, Fujian (CN); Yanyan Li, Fujian (CN); Liming Wu, Fujian (CN)

(73) Assignee: FUJIAN INSTITUTE OF RESEARCH ON THE STRUCTURE OF MATTER, CHINESE ACADEMY OF SCIENCES, Fujian (CN)

( * ) Notice: Subject to any disclaimer, the term of this patent is extended or adjusted under 35 U.S.C. 154(b) by 674 days.

(21) Appl. No.: 15/976,221

(22) Filed: May 10, 2018

(65) Prior Publication Data

US 2018/0259827 A1 Sep. 13, 2018

Related U.S. Application Data

(63) Continuation-in-part of application No. PCT/CN2016/073130, filed on Feb. 2, 2016.

(51) Int. Cl.
*C30B 29/46* (2006.01)
*G02F 1/355* (2006.01)
(Continued)

(52) U.S. Cl.
CPC ............. *G02F 1/3551* (2013.01); *C30B 1/02* (2013.01); *C30B 29/16* (2013.01); *C30B 29/46* (2013.01);
(Continued)

(58) Field of Classification Search
CPC .......... G02F 1/3551; G02F 1/39; G02F 1/392; C30B 29/46; C30B 1/02; C30B 29/16; H01S 3/163
See application file for complete search history.

(56) References Cited

U.S. PATENT DOCUMENTS 5,366,936 A * 11/1994 Vlosov .................. C03C 3/321
204/420
2002/0119278 A1* 8/2002 Bechevet ........... G11B 7/24038
428/64.4

FOREIGN PATENT DOCUMENTS

CN 102230225 A 11/2011
CN 103866391 A 6/2014
(Continued)

*Primary Examiner* — Jonathan C Langman
(74) *Attorney, Agent, or Firm* — Novick, Kim & Lee, PLLC; Allen Xue

(57) ABSTRACT

An infrared non-linear optical crystal has the following molecular formula: $A_{18}X_{21}Y_6M_{48}$, in which A is Ba, Sr or Pb; X is Zn, Cd or Mn; Y is Ga, In or Al; and M is S, Se or Te. The crystal belongs to trigonal system and has space group R3. The crystal $Ba_{18}Zn_{21}Ga_6S_{48}$ is a type I phase matching non-linear optical material, in a particle size range of 150~210 μm, its powder frequency doubling intensity and the laser damage threshold are respectively 0.5 times and 28 times those of the commercial material $AgGaS_2$. Other crystals have the same or similar structure and properties such as optical property. The infrared non-linear optical crystal of the present application has important prospects in military and civilian applications, and can be used in electro-optical countermeasures, resource detection, space antimissile and communications, etc.

16 Claims, 4 Drawing Sheets

(51) Int. Cl.
*C30B 1/02* (2006.01)
*C30B 29/16* (2006.01)
*G02F 1/39* (2006.01)
*H01S 3/16* (2006.01)

(52) U.S. Cl.
CPC ............... *G02F 1/39* (2013.01); *H01S 3/163* (2013.01); *G02F 1/392* (2021.01)

(56) References Cited

FOREIGN PATENT DOCUMENTS

| | | |
|---|---|---|
| CN | 104532351 A | 4/2015 |
| CN | 104630891 A | 5/2015 |
| CN | 104695022 A | 6/2015 |
| CN | 105002558 A | 10/2015 |

\* cited by examiner

INFRARED NON-LINEAR OPTICAL CRYSTAL, PREPARATION PROCESS AND APPLICATION THEREOF

TECHNICAL FIELD

The present invention relates to an infrared non-linear optical crystal, a preparation process and an application thereof, and belongs to the technical field of inorganic non-linear optical materials.

BACKGROUND TECHNOLOGY

Non-linear optical crystals are crystals that exhibit secondary and above non-linear optical effect for a laser strong electric field. Non-linear optical effect arises from the interaction of a laser with a medium. When a laser propagates through a medium with a non-zero second-order polarizability, non-linear optical effect occurs, such as difference frequency, sum frequency, laser frequency doubling and parametric oscillation and amplification, etc. It can be used for converting laser frequency, extending tunable range of a laser, modulating the intensity and phase of laser and achieving holographic storage of laser signals, eliminating the self-pumped phase conjugation of the wave front domain switching, etc. Non-linear optical crystals play an increasingly important role in the high and new technology, modern military and civilian applications.

According to the range of its transmittance waveband, non-linear optical crystal can be divided into the three categories of UV region, visible region and infrared region. Non-linear optical crystals of the UV and visible regions (such as $KH_2PO_4$ (KDP), $KTiOPO_4$ (KTP), $\beta$-$BaB_2O_4$ (BBO), and $LiB_3O_5$(LBO)) all have excellent optical properties and have been widely used in practical applications.

The use of conventional oxide non-linear optical crystals such as KDP, KTP, BBO, LBO and the like in the infrared waveband is severely limited due to the extremely poor infrared transmission of the oxide caused by the vibrational absorption of metal and oxygen chemical bonds (M-O). Compared with the oxide, the chalcogenide non-linear optical material has a more polarized M-Q bond (Q=S, Se, Te), a wider transmission range and a larger second-order non-linear optical coefficient in the infrared region, thus is ideal for use in the infrared waveband. For example, chalcogenide infrared non-linear optical material $AgGaQ_2$ (Q=S, Se) has achieved commercial applications. However, the smaller energy gap of $AgGaQ_2$ (Q=S, Se) leads to a lower laser damage threshold, which limits its practical application.

Therefore, finding or exploring to synthesize of a novel infrared non-linear optical crystal material with excellent comprehensive performance is one of the difficult and hot spots in the current field of non-linear optical material research.

CONTENTS OF THE INVENTION

The present invention aims to provide an infrared non-linear optical crystal, a preparation process and an application thereof. Then on-linear optical crystal is a material having infrared frequency doubling response, and has not only excellent infrared second-order non-linear optical property and higher laser damage threshold, but also fluorescence property. Its powder frequency doubling intensity and laser damage threshold can respectively reach 0.5 times and 28 times those of $AgGaS_2$.

In order to achieve the above object, the present invention provides an infrared non-linear optical crystal having the following molecular formula:

$A_{18}X_{21}Y_6M_{48}$;

wherein A is Ba, Sr or Pb; X is Zn, Cd or Mn; Y is Ga, In or Al; and M is S, Se or Te.

Preferably, the crystal structure of the infrared non-linear optical crystal belongs to a trigonal system, and the space group is R3.

Preferably, for example, the molecular formula of the infrared non-linear optical crystal may be $Ba_{18}Zn_{21}Ga_6S_{48}$, $Ba_{18}Zn_{21}Ga_6Se_{48}$, $Ba_{18}Zn_{21}Ga_6Te_{48}$, $Ba_{18}Zn_{21}In_6S_{48}$, $Ba_{18}Zn_{21}In_6Se_{48}$, $Ba_{18}Zn_{21}In_6Te_{48}$, $Ba_{18}Zn_{21}Al_6S_{48}$, $Ba_{18}Zn_{21}Al_6Se_{48}$, $Ba_{18}Zn_{21}Al_6Te_{48}$, $Ba_{18}Cd_{21}Ga_6S_{48}$, $Ba_{18}Cd_{21}Ga_6Se_{48}$, $Ba_{18}Cd_{21}Ga_6Te_{48}$, $Ba_{18}Cd_{21}In_6S_{48}$, $Ba_{18}Cd_{21}In_6Se_{48}$, $Ba_{18}Cd_{21}In_6Te_{48}$, $Ba_{18}Cd_{21}Al_6S_{48}$, $Ba_{18}Cd_{21}Al_6Se_{48}$, $Ba_{18}Cd_{21}Al_6Te_{48}$, $Ba_{18}Mn_{21}Ga_6S_{48}$, $Ba_{18}Mn_{21}Ga_6Se_{48}$, $Ba_{18}Mn_{21}Ga_6Te_{48}$, $Ba_{18}Mn_{21}In_6S_{48}$, $Ba_{18}Mn_{21}In_6Se_{48}$, $Ba_{18}Mn_{21}In_6Te_{48}$, $Ba_{18}Mn_{21}Al_6S_{48}$, $Ba_{18}Mn_{21}Al_6Te_{48}$, $Ba_{18}Mn_{21}Al_6Te_{48}$, $Sr_{18}Zn_{21}Ga_6S_{48}$, $Sr_{18}Zn_{21}Ga_6Se_{48}$, $Sr_{18}Zn_{21}Ga_6Te_{48}$, $Sr_{18}Zn_{21}In_6S_{48}$, $Sr_{18}Zn_{21}In_6S_{48}$, $Sr_{18}Zn_{21}In_6Te_{48}$, $Sr_{18}Zn_{21}Al_6S_{48}$, $Sr_{18}Zn_{21}Al_6Se_{48}$, $Sr_{18}Zn_{21}Al_6Te_{48}$, $Sr_{18}Cd_{21}Ga_6S_{48}$, $Sr_{18}Cd_{21}Ga_6Se_{48}$, $Sr_{18}Cd_{21}Ga_6Te_{48}$, $Sr_{18}Cd_{21}In_6S_{48}$, $Sr_{18}Cd_{21}In_6Se_{48}$, $Sr_{18}Cd_{21}In_6Te_{48}$, $Sr_{18}Cd_{21}Al_6S_{48}$, $Sr_{18}Cd_{21}Al_6Se_{48}$, $Sr_{18}Cd_{21}Al_6Te_{48}$, $Sr_{18}Mn_{21}Ga_6S_{48}$, $Sr_{18}Mn_{21}Ga_6Se_{48}$, $Sr_{18}Mn_{21}Ga_6Te_{48}$, $Sr_{18}Mn_{21}In_6S_{48}$, $Sr_{18}Mn_{21}In_6Se_{48}$, $Sr_{18}Mn_{21}In_6Te_{48}$, $Sr_{18}Mn_{21}Al_6S_{48}$, $Sr_{18}Mn_{21}Al_6Se_{48}$, $Sr_{18}Mn_{21}Al_6Te_{48}$, $Pb_{18}Zn_{21}Ga_6S_{48}$, $Pb_{18}Zn_{21}Ga_6Se_{48}$, $Pb_{18}Zn_{21}Ga_6Te_{48}$, $Pb_{18}Zn_{21}In_6S_{48}$, $Pb_{18}Zn_{21}In_6Se_{48}$, $Pb_{18}Zn_{21}In_6Te_{48}$, $Pb_{18}Zn_{21}Al_6S_{48}$, $Pb_{18}Zn_{21}Al_6Se_{48}$, $Pb_{18}Zn_{21}Al_6Te_{48}$, $Pb_{18}Cd_{21}Ga_6S_{48}$, $Pb_{18}Cd_{21}Ga_6Se_{48}$, $Pb_{18}Cd_{21}Ga_6Te_{48}$, $Pb_{18}Cd_{21}In_6S_{48}$, $Pb_{18}Cd_{21}In_6Se_{48}$, $Pb_{18}Cd_{21}In_6Te_{48}$, $Pb_{18}Cd_{21}Al_6S_{48}$, $Pb_{18}Cd_{21}Al_6Se_{48}$, $Pb_{18}Cd_{21}Al_6Te_{48}$, $Pb_{18}Mn_{21}Ga_6S_{48}$, $Pb_{18}Mn_{21}Ga_6Se_{48}$, $Pb_{18}Mn_{21}Ga_6Te_{48}$, $Pb_{18}Mn_{21}In_6S_{48}$, $Pb_{18}Mn_{21}In_6Se_{48}$, $Pb_{18}Mn_{21}In_6Te_{48}$, $Pb_{18}Mn_{21}Al_6S_{48}$, and $Pb_{18}Mn_{21}Al_6Te_{48}$.

Preferably, the unit cell parameters of the infrared non-linear optical crystal are a=b=7.5~11.5 Å, c=25.0~30.0 Å, $\alpha=\beta=90°$, $\gamma=120°$, and V=1300.0~3400.0 Å³.

Further, the molecular formula of the infrared non-linear optical crystal may be, for example, $Ba_{18}Zn_{21}Ga_6S_{48}$, with the unit cell parameters being a=b=9.8 Å, c=27.1 Å, $\alpha=\beta=90°$, $\gamma=120°$ and V=2231.8 Å³.

Taken as an example of $Ba_{18}Zn_{21}Ga_6S_{48}$, the crystal structure of the infrared non-linear optical crystal is, as shown in FIG. 1, mainly a three-dimensional anionic framework stacked along the c direction by two-dimensional layers consisting of $GaS_4$ tetrahedron, $Zn_4S_{10}$ T2 super tetrahedron and $Zn_3GaS_{10}$ tetramer having common vertices, and the cation $Ba^{2+}$ and the anion $S^{2-}$ are filled in the framework. Herein, the two-dimensional layers are connected by the way that three vertices of $GaS_4$ tetrahedron (the three vertices parallel to the two-dimensional plane) alternately connect one $Zn_4S_{10}$ T2 super tetrahedron and one $Zn_3GaS_{10}$ tetramer, respectively.

Further, the layers are stacked into the three-dimensional anionic framework via the common S atoms at another vertex of the $GaS_4$ tetrahedron (c direction) and the vertex of the $Zn_4S_{10}$ T2 super tetrahedron of the adjacent layer (−c direction).

According to the present invention, in addition to the excellent infrared second-order non-linear optical property, the infrared non-linear optical crystal has fluorescence property as shown in FIG. 8.

The present invention also provides a process for the preparation of the above infrared non-linear optical crystal, which comprises the following steps: placing raw materials comprising compound AM, compound XM and compound $Y_2M_3$ under vacuum condition and preparing the infrared non-linear optical crystal via a high temperature solid phase method, wherein A is Ba, Sr or Pb; X is Zn, Cd or Mn; Y is Ga, In or Al; and M is S, Se or Te.

Preferably, the molar ratio of AM, XM and $Y_2M_3$ in the raw materials is AM:XM:$Y_2M_3$=18:21:3.

According to the present invention, the process comprises the following steps: (1) fully grinding and tableting the raw materials comprising AM, XM and $Y_2M_3$, followed by sintering, to obtain a pure phase microcrystalline powder of the infrared non-linear optical crystal material; and (2) annealing the pure phase microcrystalline powder at high temperature to obtain the infrared non-linear optical crystal, which is a crystal with larger particle, specifically, with a particle size being able to reach 0.25 mm.

According to the invention, the process specifically comprises the following steps:

(1) fully grinding and tableting the raw materials comprising AM, XM and $Y_2M_3$ and then placing under vacuum condition at a temperature of 700 to 1100° C., maintaining the temperature for not less than 100 hours (for example, when AM is barium sulfide, XM is zinc sulfide, and $Y_2M_3$ is gallium sulfide, the raw materials are fully ground and tableted, then placed at 850° C. for 100 hours); and decreasing temperature to obtain the pure phase microcrystalline powder;

(2) placing the pure phase microcrystalline powder at 800-1000° C. for not less than 100 hours (for example, when AM is barium sulfide, XM is zinc sulfide and $Y_2M_3$ is gallium sulfide, the pure phase microcrystalline powder is placed at 920° C. for 100 hours); and decreasing temperature to obtain the infrared non-linear optical crystal.

Further, the temperature-decreasing process in step (1) is: programmed decreasing the temperature to 300° C. at a rate of not more than 5° C./hour and then naturally cooling to room temperature to obtain the pure phase microcrystalline powder.

Further, the temperature-decreasing process in step (2) is: programmed decreasing the temperature to 300° C. at a rate of not more than 5° C./hour and then naturally cooling to room temperature to obtain the infrared non-linear optical crystal.

Further, the process comprises the following steps:

(1a) fully grinding and mixing uniformly AM, XM and $Y_2M_3$ in a molar ratio of AM:XM:$Y_2M_3$ of 18:21:3 to obtain raw material mixture;

(1b) tableting the raw material mixture;

(1c) placing the tableted raw material mixture in a closed container, which is placed in a heating device, under vacuum condition, elevating the temperature to 700 to 1100° C. and maintaining the temperature for 100 hours, then decreasing the temperature at a rate of not more than 5° C./hour to 300° C. and stopping heating, naturally cooling to room temperature to obtain the pure phase microcrystalline powder;

(2) elevating the temperature of the pure phase microcrystalline powder to 800 to 1000° C. and maintaining the temperature for 100 hours, then programmed decreasing the temperature at a rate of not more than 5° C./hour to 300° C. and stopping heating, naturally cooling to room temperature to obtain the infrared non-linear optical crystal having a particle size in a range of about 0.03~0.25 mm.

Preferably, the AM is barium sulfide, the XM is zinc sulfide, and the $Y_2M_3$ is gallium sulfide.

The present invention also provides an infrared detector comprising any one of the above infrared non-linear optical crystals.

The present invention also provides an infrared laser comprising any of the above infrared non-linear optical crystals.

The present invention further provides use of the infrared non-linear optical crystal for infrared detectors, infrared lasers, electro-optical countermeasures, resource detection, space antimissile and communications, etc.

The beneficial effects of the present invention are as follows:

(1) The present invention provides crystal compounds having a novel structure of the general formula $A_{18}X_{21}Y_6M_{48}$, which have infrared frequency doubling response, wherein A is Ba, Sr or Pb; X is Zn, Cd or Mn; Y is Ga, In or Al; M is S, Se or Te. The above compounds, such as $Ba_{18}Zn_{21}Ga_6S_{48}$, have been tested for their properties. The test shows that the powder experimental energy gap of the crystal material is about 3.50 eV, which is much higher than the energy gap of the commercial infrared non-linear optical crystal $AgGaS_2$ (2.56 eV), indicating that it may have a larger laser damage threshold. The $Ba_{18}Zn_{21}Ga_6S_{48}$ compound is a type I phase matching compound, which has not only excellent infrared second-order non-linear optical property and higher laser damage threshold, but also fluorescence property. Its powder frequency doubling response and the laser damage threshold are respectively 0.5 times and 28 times those of $AgGaS_2$ in particle size in the range of 150-210 μm. In addition, the $Ba_{18}Zn_{21}Ga_6S_{48}$ compound has a transmission range (0.6 to 25 μm) comparable to that of $AgGaS_2$ (0.6 to 23 μm). In addition, the compound can have its particle size reach 0.25 mm, and is an infrared non-linear optical crystal material having a large particle size. Likewise, other crystal compounds having the novel structure of the general formula $A_{18}X_{21}Y_6M_{48}$ also have the same or similar properties and advantages.

(2) The present application provides a simple and efficient process for preparing the above infrared non-linear optical crystal, i.e. high-temperature solid-phase method. Specifically, the high-temperature solid-phase method comprises two steps: the first step is to fully grind and tablet the raw materials followed by sintering to firstly obtain pure phase microcrystalline powder of the non-linear optical crystal material; and the second step is to anneal the obtained pure phase microcrystalline powder of the non-linear optical crystal material at high temperature to obtain the non-linear optical crystal having a large particle size.

(3) The crystal having the above structure of the general formula of the present invention has higher crystallinity and purity, and has excellent infrared second-order non-linear optical and fluorescence properties. Therefore, the crystal has important prospects in military and civilian applications. It can be used in infrared detectors and lasers, electro-optical countermeasures, resource detection, space antimissile and communications, etc.

EMBODIMENTS

The technical solutions of the present invention are described in detail below by way of exemplary examples. However, these examples should not be construed as limiting the scope of the present invention. All the technologies achieved based on the above contents of the present invention are covered by the protection scope of the present invention.

In the present invention, raw material gallium sulfide is prepared by the boron vulcanization method, and the other two raw materials (barium sulfide and zinc sulfide) are commercially available and are used directly without special treatment.

Example 1

The raw materials barium sulfide, zinc sulfide and gallium sulfide were ground and mixed uniformly according to a molar ratio of barium sulfide:zinc sulfide:gallium sulfide of 18:21:3 to obtain a raw material mixture, followed by tableting, the tableted raw material mixture was placed in a graphite crucible.

The graphite crucible loaded with the raw material mixture was placed in a quartz reaction tube, which was vacuumed to $10^{-3}$ Pa, and sealed by oxyhydrogen flame. The sealed quartz reaction tube was placed into a tube furnace with a temperature controller, heated to 850° C. (i.e., the solid melt temperature), and maintained for at least 100 hours. Then the temperature was decreased at a rate of not more than 5° C./hour to 300° C., followed by stopping heating and naturally cooling to room temperature to obtain pure phase microcrystalline powder of the non-linear optical crystal material.

The quartz tube loaded with the above pure phase microcrystalline powder was put into a tube furnace with a temperature controller, heated to 920° C. and maintained for at least 100 hours, then cooled down to 300° C. at a rate of not more than 5° C./hour, followed by stopping heating and naturally cooling to room temperature, to obtain the non-linear optical crystal material, the crystal material was crystal having a large particle size, which could reach up to 0.25 mm.

Structural characterization of the non-linear optical crystal material obtained in Example 1

Figure 1:
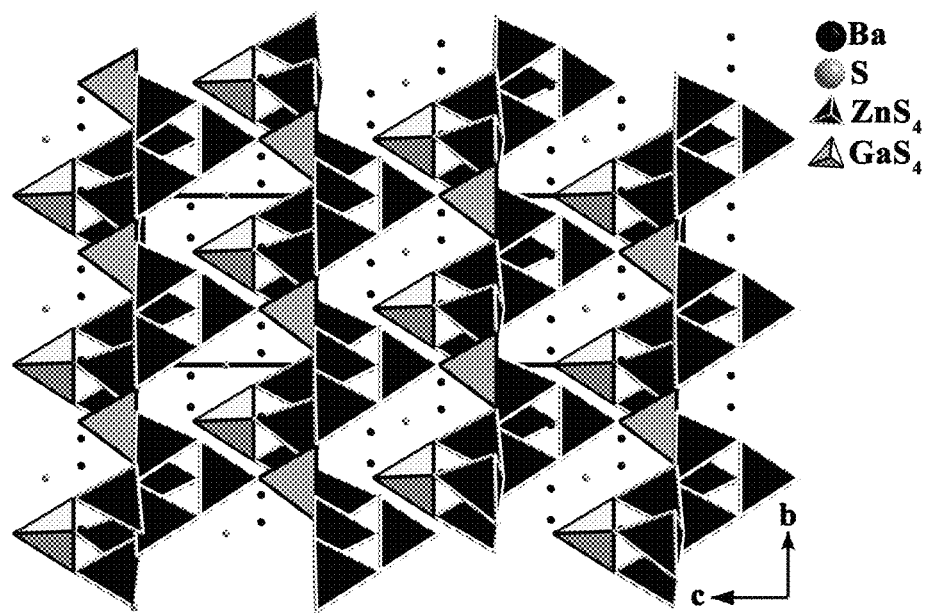
FIG. 1 is a diagram of the structure of the $Ba_{18}Zn_{21}Ga_6S_{48}$ crystal.

The X-ray single crystal diffraction of the crystal material was performed on a Mercury CCD type single crystal diffractometer with Mo target, Kα radiation source (λ=0.07107 nm) and a test temperature of 293K. Its structure was analyzed through Shelxtl97. The results of its crystallographic data are shown in Table 1, and the crystal structure diagram is shown in FIG. 1.

TABLE 1

Crystallographic data of the sample $Ba_{18}Zn_{21}Ga_6S_{48}$

| Parameters | Crystal $Ba_{18}Zn_{21}Ga_6S_{48}$ |
|---|---|
| Molecular formula | $Ba_{18}Zn_{21}Ga_6S_{48}$ |
| Molecular weight | 1934.03 |
| Space group | Trigonal (R3) |
| a axis (Å) | 9.7679(2) |
| c axis (Å) | 27.009(2) |
| α = β | 90° |
| γ | 120° |
| Volume V (Å³) | 2231.75(9) |
| Density Dc (g · cm⁻³) | 4.317 |

As shown in FIG. 1, the crystal structure of the crystal is mainly a three-dimensional anionic framework stacked along the c direction by two-dimensional layers consisting of $GaS_4$ tetrahedron, $Zn_4S_{10}$ T2 super tetrahedron and $Zn_3GaS_{10}$ tetramer via common vertices, and the cation $Ba^{2+}$ and the anion $S^{2-}$ are filled in the framework.

Figure 2:
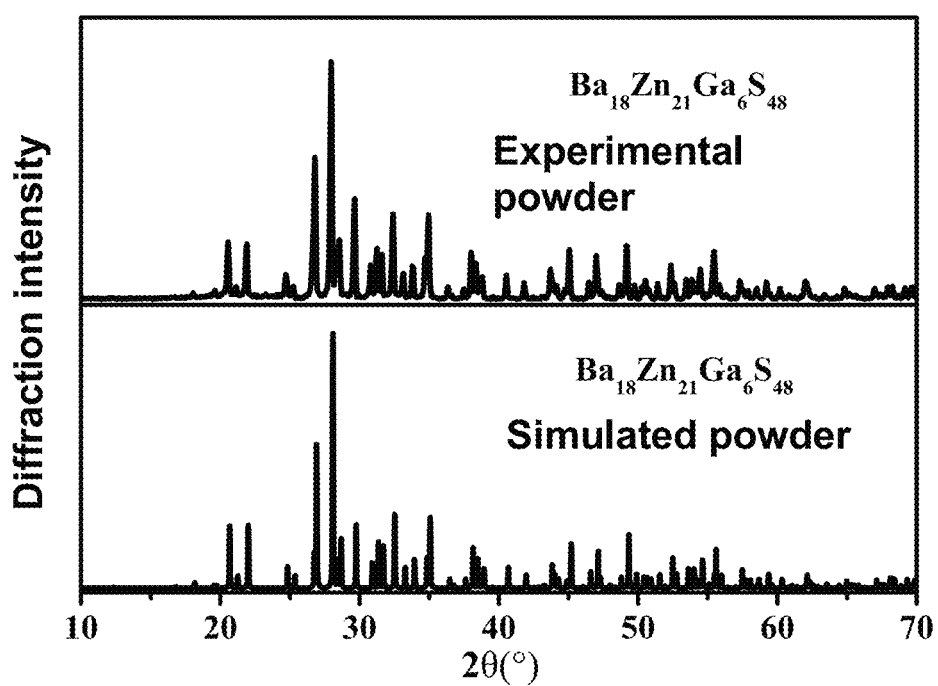
FIG. 2 is the powder X-ray diffraction pattern of $Ba_{18}Zn_{21}Ga_6S_{48}$.

The X-ray powder diffraction phase analysis (XRD) of the non-linear optical crystal obtained in Example 1 was performed on a MiniFlexII type X-ray diffractometer from Rigaku Corporation, with Cu target, and Kα radiation source (λ=0.154184 nm). The powder XRD pattern of the sample and the XRD pattern obtained by fitting of the single crystal diffraction data are shown in FIG. 2. It can be seen from FIG. 2 that the XRD pattern of the sample is consistent with the XRD pattern obtained by fitting of the single crystal diffraction data, indicating that the obtained sample has high crystallinity and purity.

Characterization of optical properties of the non-linear optical crystals obtained in Example 1

Figure 3:
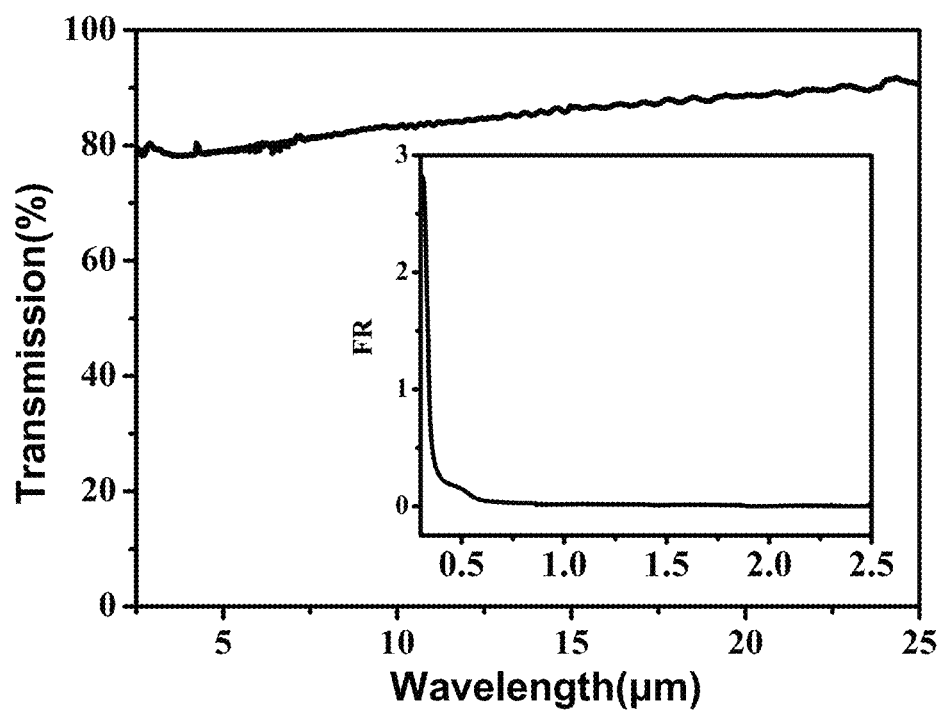
FIG. 3 is the crystal FT-IR spectrum of $Ba_{18}Zn_{21}Ga_6S_{48}$.

The optical properties of the samples were characterized on Nicolet Magna 750 FT-IR infrared spectrometer and PE Lambda 950 UV-visible (near infrared) absorption or diffuse reflectance spectrometer. The results are shown in FIG. 3. It can be seen from FIG. 3 that the powder transmission range of the sample is 0.6 to 25 μm.

Figure 4:
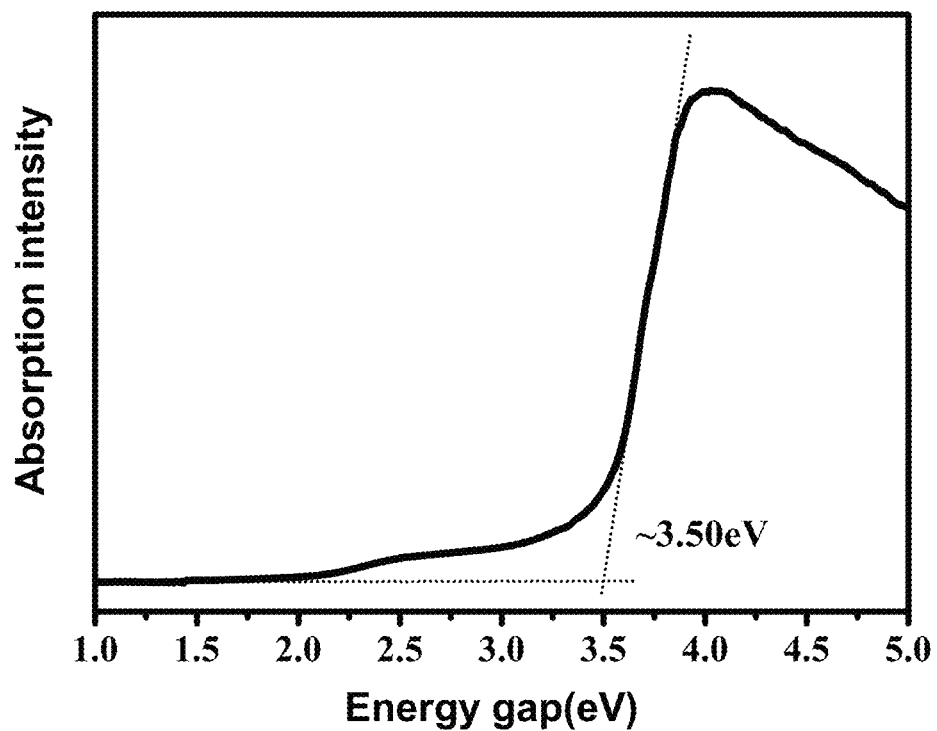
FIG. 4 is the powder experimental energy gap of $Ba_{18}Zn_{21}Ga_6S_{48}$.
Figure 5:
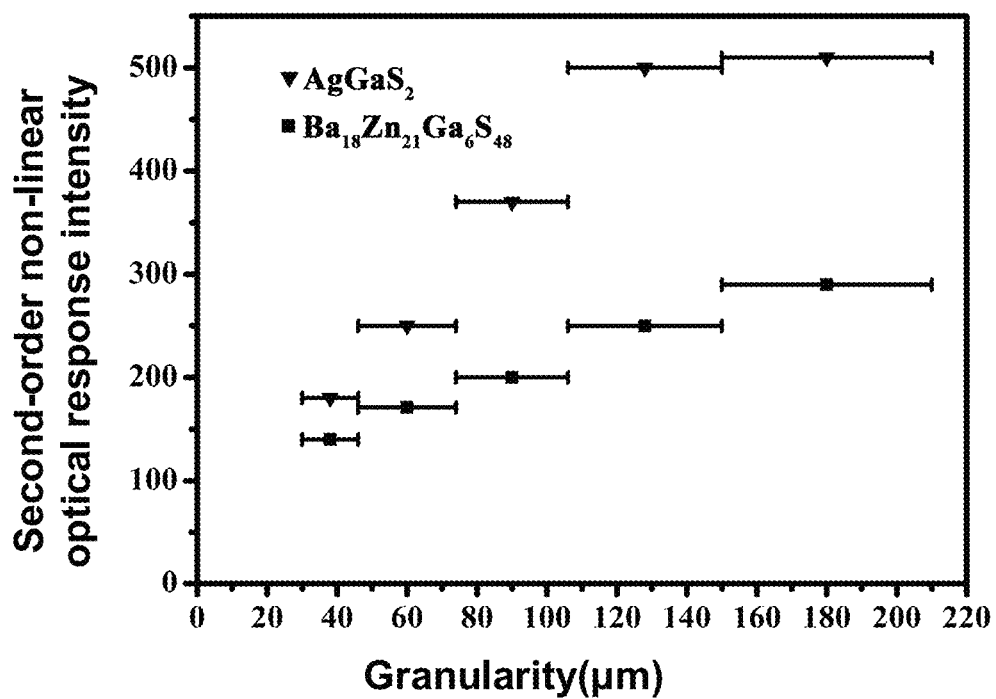
FIG. 5 is the relationship diagram of the change of the powder frequency doubling intensity of $Ba_{18}Zn_{21}Ga_6S_{48}$ with granularity.
Figure 6:
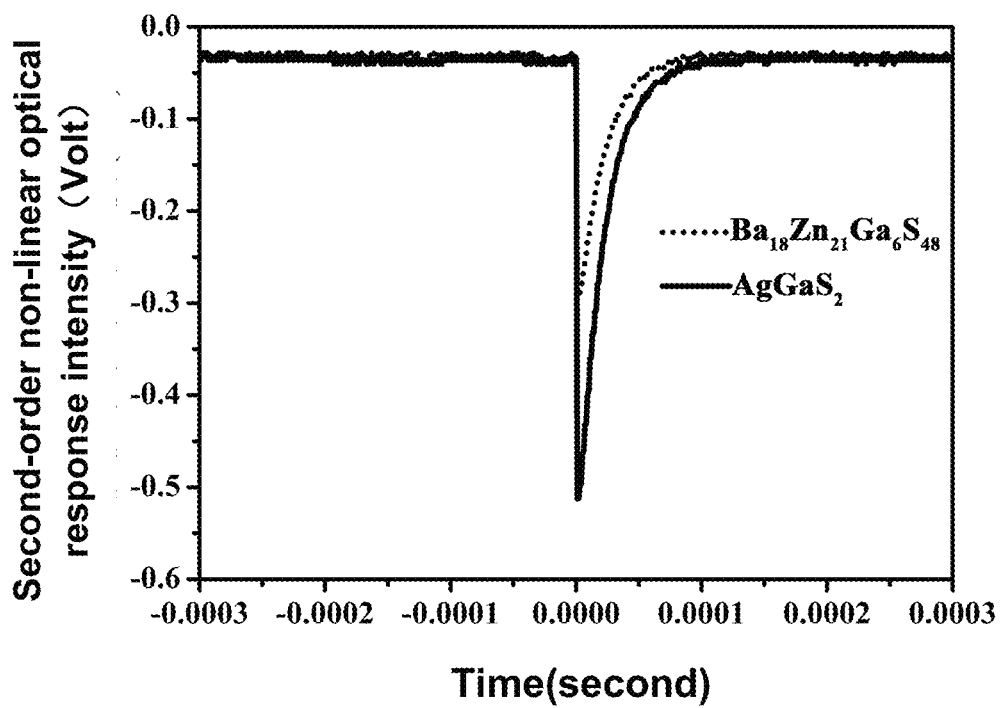
FIG. 6 is the relationship diagram of the powder frequency doubling intensity of $Ba_{18}Zn_{21}Ga_6S_{48}$ and that of reference $AgGaS_2$ (150~210 μm).
Figure 7:
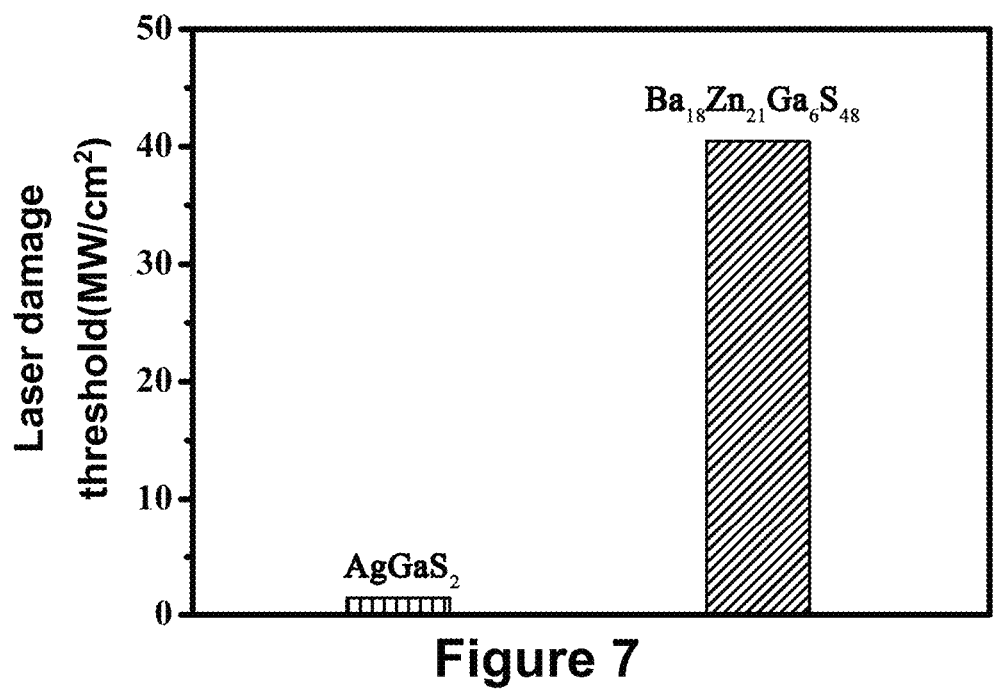
FIG. 7 is the relationship diagram of the powder laser damage threshold of $Ba_{18}Zn_{21}Ga_6S_{48}$ and that of reference $AgGaS_2$ (150~210 μm).
Figure 8:
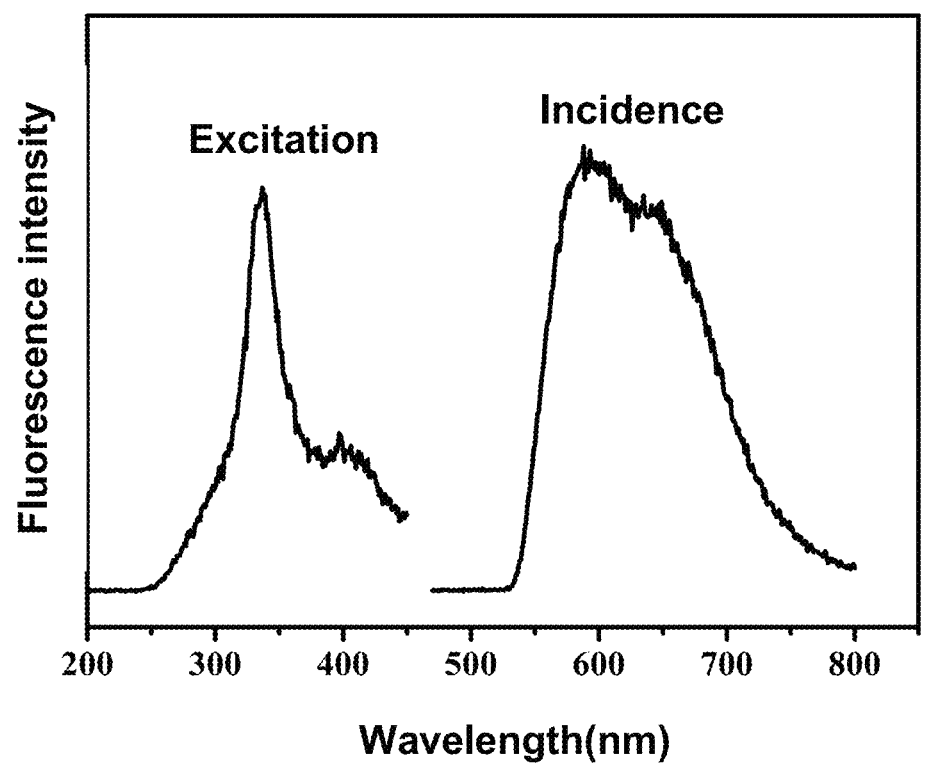
FIG. 8 is the fluorescence spectrum of $Ba_{18}Zn_{21}Ga_6S_{48}$.

The powder experimental energy gap of the sample is shown in FIG. 4. The relationship of the change of the powder frequency doubling intensity of the sample with granularity is shown in FIG. 5. The relationship between the powder frequency doubling intensity of the sample and that of the reference $AgGaS_2$ (150-210 μm) is shown in FIG. 6. The relationship between the powder laser damage threshold of the sample and that of the reference $AgGaS_2$ (150~210 μm) is shown in FIG. 7. The fluorescence property is shown in FIG. 8. The specific values are listed in Table 2.

TABLE 2

Data of optical properties of sample

| Sample | Powder frequency doubling intensity*[1] (mV) | Laser damage threshold intensity*[2] (MW/cm$^2$) | Light transmittance range (μm) | Band gap (eV) |
|---|---|---|---|---|
| $Ba_{18}Zn_{21}Ga_6S_{48}$ | 260 | 40.4749 | 0.6~25 | 3.5 |
| $AgGaS_2$ | 520 | 1.4416 | 0.6~23 | 2.56 |

*[1]The granularity range of the sample and reference $AgGaS_2$ was 150~210 μm, and the incident laser wavelength was 2050 nm.
*[2]The granularity range of the sample and reference $AgGaS_2$ was 150~210 μm, laser wavelength was 1064 nm, working frequency was 1 Hz, pulse width was 10 ns, and laser energy was 1 to 100 mJ, which was adjustable, and the focal length of the lens was f = 20 cm.

The present invention has obtained $Ba_{18}Zn_{21}Ga_6S_{48}$ by a two-step solid-phase synthesis method, and has realized the multi-functionalization of the second-order nonlinearity and the fluorescence property.

Examples 2-7

Examples 2-7 adopted the same preparation process as that in Example 1 except that the raw materials were the compounds shown in Table 3. The prepared crystals were tested to have the same or similar structure and optical properties to those of the $Ba_{18}Zn_{21}Ga_6S_{48}$ crystal in Example 1.

TABLE 3

Raw materials of Examples 2-7

| | AM | XM | $Y_2M_3$ |
|---|---|---|---|
| Example 2 | SrS | ZnS | $Ga_2S_3$ |
| Example 3 | PbS | ZnS | $Ga_2S_3$ |
| Example 4 | BaS | CdS | $Ga_2S_3$ |
| Example 5 | BaS | ZnS | $In_2S_3$ |
| Example 6 | SrS | CdS | $Ga_2S_3$ |
| Example 7 | BaSe | ZnSe | $Ga_2Se_3$ |

The above descriptions are merely some examples of the present invention, and are not intended to limit the present invention in any form. Although the present invention is disclosed by the above preferred examples, those examples are not intended to limit the present invention. Changes or modifications made by any one skilled in the art using the technical contents disclosed above without departing from the technical solutions of the present invention are all equivalent implementation examples and fall within the scope of the technical solutions.

The invention claimed is:

1. An infrared non-linear optical crystal, wherein the crystal has the following molecular formula:

$A_{18}X_{21}Y_6M_{48}$, wherein A is Ba, Sr or Pb; X is Zn, Cd or Mn; Y is Ga, In or Al; and M is S, Se or Te; and the crystal structure of the infrared non-linear optical crystal belongs to a trigonal system, and is in space group R3.

2. The infrared non-linear optical crystal according to claim 1, having a formula of $Ba_{18}Zn_{21}Ga_6S_{48}$, $Ba_{18}Zn_{21}Ga_6Se_{48}$, $Ba_{18}Zn_{21}Ga_6Te_{48}$, $Ba_{18}Zn_{21}In_6S_{48}$, $Ba_{18}Zn_{21}In_6Se_{48}$, $Ba_{18}Zn_{21}In_6Te_{48}$, $Ba_{18}Zn_{21}Al_6S_{48}$, $Ba_{18}Zn_{21}Al_6Se_{48}$, $Ba_{18}Zn_{21}Al_6Te_{48}$, $Ba_{18}Cd_{21}Ga_6S_{48}$, $Ba_{18}Cd_{21}Ga_6Se_{48}$, $Ba_{18}Cd_{21}Ga_6Te_{48}$, $Ba_{18}Cd_{21}In_6S_{48}$, $Ba_{18}Cd_{21}In_6Se_{48}$, $Ba_{18}Cd_{21}In_6Te_{48}$, $Ba_{18}Cd_{21}Al_6S_{48}$, $Ba_{18}Cd_{21}Al_6Se_{48}$, $Ba_{18}Cd_{21}Al_6Te_{48}$, $Ba_{18}Mn_{21}Ga_6S_{48}$, $Ba_{18}Mn_{21}Ga_6Se_{48}$, $Ba_{18}Mn_{21}Ga_6Te_{48}$, $Ba_{18}Mn_{21}In_6S_{48}$, $Ba_{18}Mn_{21}In_6Se_{48}$, $Ba_{18}Mn_{21}In_6Te_{48}$, $Ba_{18}Mn_{21}Al_6S_{48}$, $Ba_{18}Mn_{21}Al_6Se_{48}$, $Ba_{18}Mn_{21}Al_6Te_{48}$, $Sr_{18}Zn_{21}Ga_6S_{48}$, $Sr_{18}Zn_{21}Ga_6Se_{48}$, $Sr_{18}Zn_{21}Ga_6Te_{48}$, $Sr_{18}Zn_{21}In_6S_{48}$, $Sr_{18}Zn_{21}In_6Se_{48}$, $Sr_{18}Zn_{21}In_6Te_{48}$, $Sr_{18}Zn_{21}Al_6S_{48}$, $Sr_{18}Zn_{21}Al_6Se_{48}$, $Sr_{18}Zn_{21}Al_6Te_{48}$, $Sr_{18}Cd_{21}Ga_6S_{48}$, $Sr_{18}Cd_{21}Ga_6Se_{48}$, $Sr_{18}Cd_{21}Ga_6Te_{48}$, $Sr_{18}Cd_{21}In_6S_{48}$, $Sr_{18}Cd_{21}In_6Se_{48}$, $Sr_{18}Cd_{21}In_6Te_{48}$, $Sr_{18}Cd_{21}Al_6S_{48}$, $Sr_{18}Cd_{21}Al_6Se_{48}$, $Sr_{18}Cd_{21}Al_6Te_{48}$, $Sr_{18}Mn_{21}Ga_6S_{48}$, $Sr_{18}Mn_{21}Ga_6Se_{48}$, $Sr_{18}Mn_{21}Ga_6Te_{48}$, $Sr_{18}Mn_{21}In_6S_{48}$, $Sr_{18}Mn_{21}In_6Se_{48}$, $Sr_{18}Mn_{21}In_6Te_{48}$, $Sr_{18}Mn_{21}Al_6S_{48}$, $Sr_{18}Mn_{21}Al_6Se_{48}$, $Sr_{18}Mn_{21}Al_6Te_{48}$, $Pb_{18}Zn_{21}Ga_6S_{48}$, $Pb_{18}Zn_{21}Ga_6Se_{48}$, $Pb_{18}Zn_{21}Ga_6Te_{48}$, $Pb_{18}Zn_{21}In_6S_{48}$, $Pb_{18}Zn_{21}In_6Se_{48}$, $Pb_{18}Zn_{21}In_6Te_{48}$, $Pb_{18}Zn_{21}Al_6S_{48}$, $Pb_{18}Zn_{21}Al_6Se_{48}$, $Pb_{18}Zn_{21}Al_6Te_{48}$, $Pb_{18}Cd_{21}Ga_6S_{48}$, $Pb_{18}Cd_{21}Ga_6Se_{48}$, $Pb_{18}Cd_{21}Ga_6Te_{48}$, $Pb_{18}Cd_{21}In_6S_{48}$, $Pb_{18}Cd_{21}In_6Se_{48}$, $Pb_{18}Cd_{21}In_6Te_{48}$, $Pb_{18}Cd_{21}Al_6S_{48}$, $Pb_{18}Cd_{21}Al_6Se_{48}$, $Pb_{18}Cd_{21}Al_6Te_{48}$, $Pb_{18}Mn_{21}Ga_6S_{48}$, $Pb_{18}Mn_{21}Ga_6Se_{48}$, $Pb_{18}Mn_{21}Ga_6Te_{48}$, $Pb_{18}Mn_{21}In_6S_{48}$, $Pb_{18}Mn_{21}In_6Se_{48}$, $Pb_{18}Mn_{21}In_6Te_{48}$, $Pb_{18}Mn_{21}Al_6S_{48}$, or $Pb_{18}Mn_{21}Al_6Te_{48}$.

3. The infrared non-linear optical crystal according to claim 2, wherein the formula is $Ba_{18}Zn_{21}Ga_6S_{48}$, and has a structure of a three-dimensional anionic framework stacked along the c direction thereof a plurality of two-dimensional layers consisting of $GaS_4$ tetrahedron, $Zn_4S_{10}$ T2 super tetrahedron, and $Zn_3GaS_{10}$ tetramer having common vertices, and $Ba^{2+}$ cations and $S^{2-}$ anions reside in the framework;
wherein each two-dimensional layer is formed by connecting three vertices of $GaS_4$ tetrahedron parallel to the two-dimensional layer alternately with one $Zn_4S_{10}$ T2 super tetrahedron and one $Zn_3GaS_{10}$ tetramer, respectively; and
wherein the plurality of two-dimensional layers are stacked into the three-dimensional anionic framework via common S atoms shared by the vertex of the $GaS_4$ tetrahedron (c direction) in one two-dimensional layer and the vertex of the $Zn_4S_{10}$ T2 super tetrahedron of the adjacent two-dimensional layer (−c direction).

4. The infrared non-linear optical crystal according to claim 1, wherein the formula is $Ba_{18}Zn_{21}Ga_6S_{48}$, has a structure of a three-dimensional anionic framework stacked along the c direction thereof a plurality of two-dimensional layers consisting of $GaS_4$ tetrahedron, $Zn_4S_{10}$ T2 super tetrahedron, and $Zn_3GaS_{10}$ tetramer having common vertices, and $Ba^{2+}$ cations and $S^{2-}$ anions reside in the framework;
wherein each two-dimensional layer is formed by connecting three vertices of $GaS_4$ tetrahedron parallel to the two-dimensional layer alternately with one $Zn_4S_{10}$ T2 super tetrahedron and one $Zn_3GaS_{10}$ tetramer, respectively; and
wherein the plurality of two-dimensional layers are stacked into the three-dimensional anionic framework via common S atoms shared by the vertex of the $GaS_4$ tetrahedron (c direction) in one two-dimensional layer and the vertex of the $Zn_4S_{10}$ T2 super tetrahedron of the adjacent two-dimensional layer (−c direction).

5. The infrared non-linear crystal of claim 1, having unit cell parameters of a=b=7.5 to 11.5 Å, c=25.0 to 30.0 Å, α=β=90°, γ=120°, and V=1300.0 to 3400.0 Å$^3$.

6. The infrared non-linear crystal of claim 1, having a formula of $Ba_{18}Zn_{21}Ga_6S_{48}$ and unit cell parameters of a=b=9.8 Å, c=27.1 Å, α=β=90°, γ=120°, and V=2231.8 Å$^3$.

7. A process for the preparation of the infrared non-linear optical crystal according to claim 1, comprising: placing a raw material comprising compound AM, compound XM, and compound $Y_2M_3$ under vacuum condition; and preparing the infrared non-linear optical crystal via a high temperature solid phase method, wherein A is Ba, Sr or Pb; X is Zn, Cd or Mn; Y is Ga, In or Al; and M is S, Se or Te, and wherein the molar ratio of AM, XM, and $Y_2M_3$ in the raw materials is AM:XM:$Y_2M_3$=18:21:3.

8. The preparation process according to claim 7, further comprising: (1) fully grinding and tableting the raw material, followed by sintering, to obtain a pure phase microcrystalline powder of the infrared non-linear optical crystal material; and (2) annealing the pure phase microcrystalline powder at high temperature to obtain the infrared non-linear optical crystal having a particle size of up to 0.25 mm.

9. The preparation process according to claim 7, comprising:
(1) fully grinding and tableting the raw material and then placing under vacuum condition at a temperature of 700 to 1100° C., maintaining the temperature for not less than 100 hours; and decreasing temperature to obtain a pure phase microcrystalline powder; and
(2) heating the pure phase microcrystalline powder at 800-1000° C. for not less than 100 hours; and decreasing temperature to obtain the infrared non-linear optical crystal.

10. The preparation process according to claim 7, comprising:
(1a) fully grinding and mixing uniformly AM, XM, and $Y_2M_3$ at a molar ratio of AM:XM:$Y_2M_3$ of 18:21:3 to obtain the raw material;
(1b) tableting the raw material;
(1c) placing the tableted raw material in a closed container in a heating device, under vacuum condition, elevating the temperature to 700 to 1100° C. and maintaining the temperature for 100 hours, then decreasing the temperature at a rate of not more than 5° C./hour to 300° C. and stopping heating, naturally cooling to room temperature to obtain a pure phase microcrystalline powder;
(2) elevating the temperature of the pure phase microcrystalline powder to 800 to 1000° C. and maintaining the temperature for 100 hours, then decreasing the temperature at a rate of not more than 5° C./hour to 300° C. and stopping heating, naturally cooling to room temperature to obtain the infrared non-linear optical crystal having a particle size in a range of about 0.03 to 0.25 mm,
wherein the AM is barium sulfide, the XM is zinc sulfide, and the $Y_2M_3$ is gallium sulfide.

11. The preparation process according to claim 9, wherein the temperature-decreasing process in step (1) is: programmed decreasing the temperature to 300° C. at a rate of not more than 5° C./hour and then naturally cooling to room temperature to obtain the pure phase microcrystalline powder.

12. The preparation process according to claim 9, wherein the temperature-decreasing process in step (2) is: programmed decreasing the temperature to 300° C. at a rate of not more than 5° C./hour and then naturally cooling to room temperature to obtain the infrared non-linear optical crystal.

13. An infrared detector comprising the infrared non-linear optical crystal according to claim 1.

14. An infrared detector comprising the infrared non-linear optical crystal prepared by the process of claim 7.

15. An infrared laser comprising the infrared non-linear optical crystal according to claim 1.

16. An infrared laser comprising the infrared non-linear optical crystal prepared by the process of claim 7.

* * * * *